United States Patent
Kim et al.

(10) Patent No.: US 11,984,856 B2
(45) Date of Patent: May 14, 2024

(54) LOW NOISE AMPLIFIER AND OPERATION METHOD OF LOW NOISE AMPLIFIER

(71) Applicant: SAMSUNG ELECTRO-MECHANICS CO., LTD., Suwon-si (KR)

(72) Inventors: Gyu-Suck Kim, Suwon-si (KR); Youngsik Hur, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 430 days.

(21) Appl. No.: 17/360,794

(22) Filed: Jun. 28, 2021

(65) Prior Publication Data

US 2022/0200537 A1 Jun. 23, 2022

(30) Foreign Application Priority Data

Dec. 23, 2020 (KR) .......................... 10-2020-0182450

(51) Int. Cl.
*H03F 1/22* (2006.01)
*H03F 1/26* (2006.01)

(52) U.S. Cl.
CPC .............. *H03F 1/223* (2013.01); *H03F 1/26* (2013.01); *H03F 2200/294* (2013.01); *H03F 2200/318* (2013.01); *H03F 2200/451* (2013.01)

(58) Field of Classification Search
CPC ...... H03F 1/223; H03F 1/26; H03F 2200/294; H03F 2200/318; H03F 2200/451; H03F 3/193; H03F 1/565; H03G 3/30; H03G 3/3036
USPC .................................. 330/311, 277–278, 283
See application file for complete search history.

(56) References Cited

U.S. PATENT DOCUMENTS

| | | | |
|---|---|---|---|
| 6,046,640 A * | 4/2000 | Brunner | H03G 1/0023 330/311 |
| 6,933,779 B2 | 8/2005 | Lee et al. | |
| 9,106,185 B2 * | 8/2015 | Youssef | H03F 1/08 |
| 2020/0328724 A1 | 10/2020 | Ayranci et al. | |
| 2020/0366256 A1 | 11/2020 | Pehlivanoglu | |

FOREIGN PATENT DOCUMENTS

KR 10-0704568 B1 4/2007

* cited by examiner

*Primary Examiner* — Hieu P Nguyen
(74) *Attorney, Agent, or Firm* — NSIP Law (57) ABSTRACT

A low noise amplifier includes: an amplification unit including a first transistor and a second transistor connected in a cascode structure and configured to amplify a signal input to a control terminal of the first transistor; and a gain controller connected between a contact point at which the first transistor and the second transistor are connected to each other and a power source voltage, and configured to adjust a gain of the amplification unit.

20 Claims, 11 Drawing Sheets

LOW NOISE AMPLIFIER AND OPERATION METHOD OF LOW NOISE AMPLIFIER

CROSS-REFERENCE TO RELATED APPLICATIONS

This application claims the benefit under 35 U.S.C. § 119(a) of Korean Patent Application No. 10-2020-0182450 filed on Dec. 23, 2020 in the Korean Intellectual Property Office, the entire disclosure of which is incorporated herein by reference for all purposes.

BACKGROUND

1. Field

The following description relates to a low noise amplifier and an operation method of a low noise amplifier.

2. Description of Related Art

A low noise amplifier (LNA) may be included in a receiver of a wireless communication device and may amplify a weak signal received through an antenna into a signal that is robust against noise. Such a low noise amplifier is an important circuit that determines the noise performance of the receiver. Also, since the gain of the low noise amplifier also plays a role of suppressing a noise figure of a next stage of the low noise amplifier, a low noise amplifier design with sufficient gain is required.

The low noise amplifier needs to adjust the gain according to a size (e.g., magnitude) of the received signal. Since the size of a signal received through the antenna may vary, the gain of the low noise amplifier needs to be adjusted according to the size of the received signal. That is, a low noise amplifier of which gain is adjusted according to the size of the received signal is required.

A conventional low noise amplifier has a structure in which separate paths are formed according to gain modes to control the gain. In this structure, a matching network and a switch are separately positioned in each path, so the entire size of the low noise amplifier may be increased. Additionally, a design that satisfies performance factors (e.g., the noise figure, a phase discontinuity, an impedance matching characteristic, linearity, etc.) of the low noise amplifier is required for each path.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a low noise amplifier includes: an amplification unit including a first transistor and a second transistor connected in a cascode structure and configured to amplify a signal input to a control terminal of the first transistor; and a gain controller connected between a contact point at which the first transistor and the second transistor are connected to each other and a power source voltage, and configured to adjust a gain of the amplification unit.

In a first gain mode, the signal may be amplified through a path formed through the first transistor and the second transistor. In a second gain mode having a lower gain than the first gain mode, the signal may be amplified through the path.

The low noise amplifier may further include: an input matching network connected to the control terminal of the first transistor, and an output matching network connected to a first terminal of the second transistor. The path may be formed through the input matching network, the first transistor, the second transistor, and the output matching network.

The gain controller may be further configured to generate a current flowing toward the contact point, and adjust the gain by changing a value of the current.

The gain controller may include a third transistor connected between the contact point and the power source voltage. A gain control voltage for adjusting the gain may be applied to a control terminal of the third transistor.

The gain may decrease as the gain control voltage increases.

A first terminal of the first transistor may be connected to a ground. A second terminal of the first transistor may be connected to a first terminal of the second transistor. The signal may be output to a second terminal of the second transistor after being amplified.

The low noise amplifier may further include an inductor connected between the first terminal of the first transistor and the ground.

The gain controller may include a plurality of transistors connected between the contact point and the power source voltage. A gain control voltage for adjusting the gain may be applied to a control terminal of the plurality of transistors.

The gain controller may be further configured to adjust a transconductance value of the second transistor by changing the value of the current.

In another general aspect, an operation method of a low noise amplifier including a first transistor and a second transistor connected to each other in a cascode structure may include: in a first gain mode, providing a first current to a contact point at which the first transistor and the second transistor are connected to each other; in the first gain mode, amplifying a first radio frequency (RF) signal input to a control terminal of the first transistor with a first gain corresponding to the first current; in a second gain mode, providing a second current larger than the first current to the contact point; and, in the second gain mode, amplifying a second RF signal input to the control terminal of the first transistor with a second gain larger than the first gain, and corresponding to the second current.

In the first gain mode, the first RF signal may be amplified through a path formed through the first transistor and the second transistor. In the second gain mode, the second RF signal may be amplified through the path.

The low noise amplifier may further include a matching network connected to the control terminal of the first transistor and an output matching network connected to a first terminal of the second transistor. The path may be formed through the input matching network, the first transistor, the second transistor, and the output matching network.

The providing of the first current may include applying a first voltage to a control terminal of a third transistor connected between a power source voltage and the contact point. The providing of the second current may include applying a second voltage higher than the first voltage to the control terminal of the third transistor.

The first transistor may be a common source structure and the second transistor may be a common gate structure.

In another general aspect, an amplifier includes: an amplification section including a first transistor and a second transistor connected in a cascode structure and configured to amplify a signal input to a control terminal of the first transistor; and a gain controller connected between the amplification section and a power source voltage, and configured to adjust a gain of the amplification section by selectively applying different gain modes. The signal is amplified through a same path in each of the different gain modes.

The gain controller may be connected to the amplification section at a contact point at which the first transistor and the second transistor are connected to each other.

The same path may be formed through the first transistor and the second transistor.

The amplifier may further include: an input matching network connected to the first transistor, and an output matching network connected to the second transistor. The same path may be formed through the input matching network, the first transistor, the second transistor, and the output matching network.

The gain controller may include a third transistor connected between the amplification section and the power source voltage. A gain control voltage for adjusting the gain may be applied to a control terminal of the third transistor.

The gain may decrease as the gain control voltage increases.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Throughout this disclosure, an RF signal may have a format according to Wi-Fi (IEEE 802.11 family, etc.), WiMAX (IEEE 802.16 family, etc.), IEEE 802.20, LTE (long term evolution), Ev-DO, HSPA, HSDPA, HSUPA, EDGE, GSM, GPS, GPRS, CDMA, TDMA, DECT, Bluetooth, 3G, 4G, 5G, and other wireless and wired protocols designated later, but is not limited to such formats.

Figure 1:
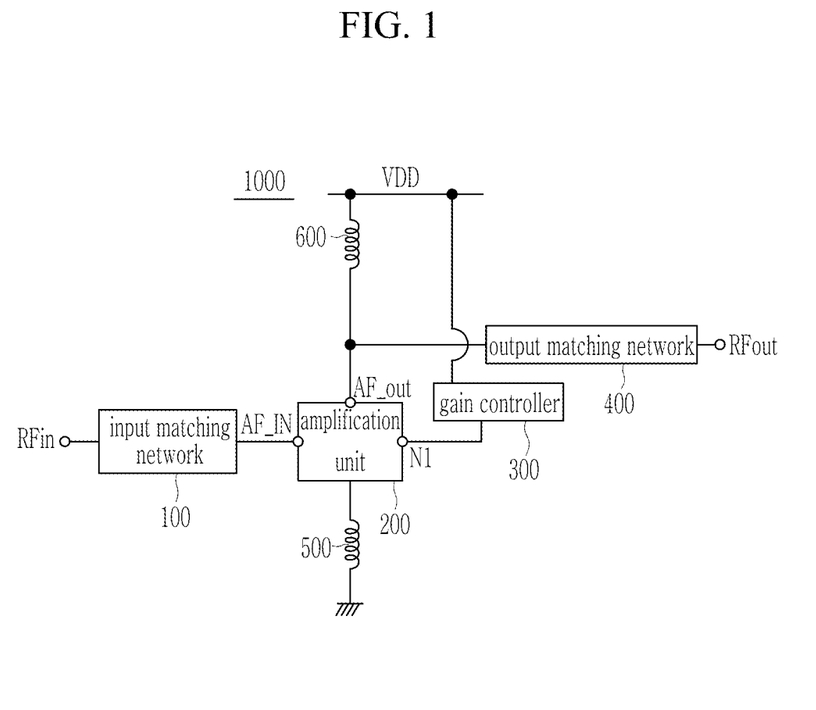
FIG. 1 is a block diagram showing a low noise amplifier, according to an embodiment.

FIG. 1 is a block diagram showing a low noise amplifier 1000, according to an embodiment.

As shown in FIG. 1, the low noise amplifier 1000 may include, for example, an input matching network 100, an amplification unit, or amplification section, 200, a gain controller 300, an output impedance network 400, an inductor 500, and an inductor 600.

The input matching network 100 may be connected to an input terminal AF_IN of the amplification unit 200 and perform impedance matching between an input RF (Radio Frequency) signal RFin and the amplification unit 200. Also, the output matching network 400 may be connected to an output terminal AF_OUT of the amplification unit 200, and may perform impedance matching between the RF output signal RFout and a next stage (i.e., a next stage of the low noise amplifier). The input matching network 100 and the output matching network 400 may be implemented with at least one combination of resistors, inductors, and capacitors, respectively.

The amplification unit 200 may amplify the RF signal input from the input terminal AF_IN with a predetermined gain Gain and then output it to the output terminal AF_OUT. In the amplification unit 200 according to an embodiment, the gain Gain may be adjusted (variable) by the gain controller 300. The amplification unit 200 may include two transistors connected to each other in a cascode structure. The RF signal may be input to the control terminal of one transistor among the two transistors and the amplified RF signal may be output to the first terminal (a drain) of the other transistor among the two transistors. In addition, the amplification unit 200 does not separately form a path through which the RF signal passes according to the gain mode (hereinafter referred to as 'an RF signal path') and may form only one RF signal path according to the gain mode. A specific configuration of the amplification unit 200 is illustrated in detail in FIG. 2.

The gain controller 300 is connected between a power source voltage VDD and a predetermined point N1 of the amplification unit 200, and performs a role of adjusting (varying) the gain Gain of the amplification unit 200. That is, the gain controller 300 may adjust the gain of the amplification unit 200 according to the gain mode. The predetermined point N1 of the amplification unit 200 may correspond to a contact point of the two transistors connected to each other in a cascode structure. A method in which the gain controller 300 adjusts the gain of the amplification unit 200 is described in detail in FIG. 2.

The inductor 500 may be connected between the amplification unit 200 and a ground. The inductor 500 is a degeneration circuit and may improve impedance matching of the input matching network 100. Through this impedance matching, the inductor 500 may optimize the gain and the noise figure of the low noise amplifier 1000. When the amplification unit 200 is implemented as a bipolar transistor, the inductor 500 may provide emitter degeneration. In addition, when the amplification unit 200 is implemented as an electric field effect transistor (FET), the inductor 500 may provide source degeneration. The inductor 500 may be replaced with a resistor to act as a degeneration circuit.

The inductor 600 may be connected to a power source voltage VDD and an output terminal AF_OUT of the amplification unit 200. That is, the amplification unit 200 may receive the power source voltage VDD through the inductor 600. The inductor 600 may perform an RF choke function.

Figure 2:
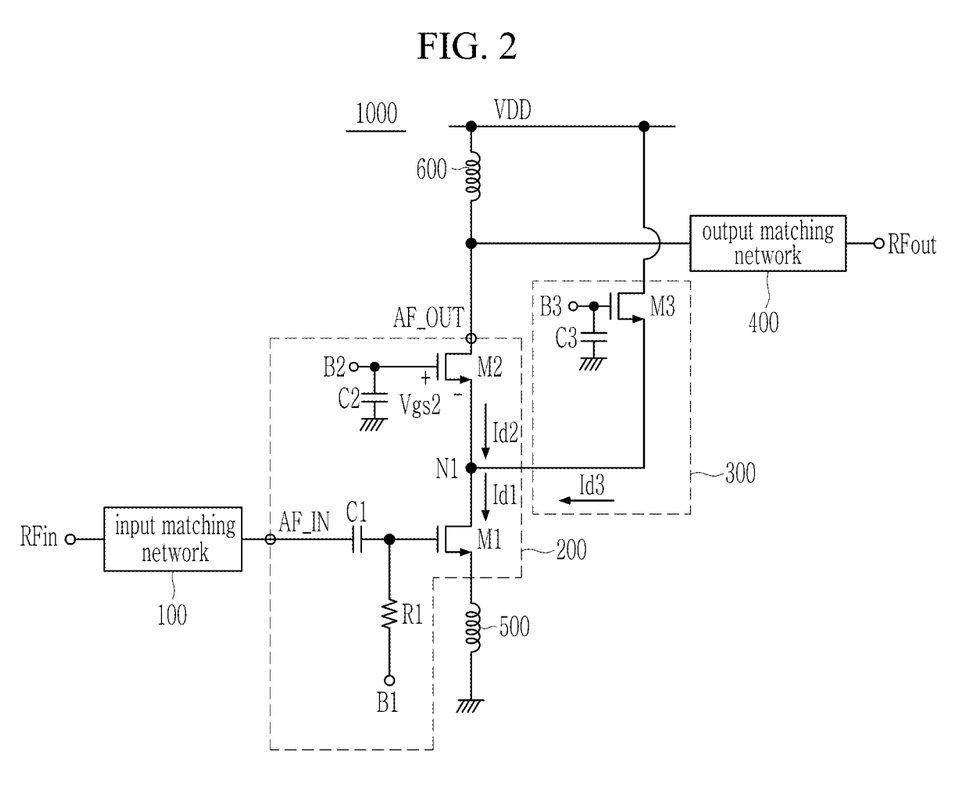
FIG. 2 is a circuit diagram showing a more specific configuration of the low noise amplifier of FIG. 1, according to an embodiment.

FIG. 2 is a circuit diagram showing a more specific configuration of the low noise amplifier 1000, according to an embodiment.

Transistors M1, M2, and M3 of FIG. 2 may each be implemented with various transistors such as an electric field effect transistor (FET) and a bipolar transistor. Also, in FIG. 2, the transistors M1, M2, and M3 are shown as N-type transistors, but, in another example, the transistors M1, M2, and M3 may be P-type transistors. In the following description, it is assumed that the transistors M1, M2, and M3 are FETs for better understanding and ease of description, but other transistors may be substituted.

The amplification unit 200 may include the transistor M1 and the transistor M2. As shown in FIG. 2, the transistor M1 and the transistor M2 may be connected to each other in a cascode structure. That is, the drain of the transistor M1 and the source of the transistor M2 are connected to each other and the input RF signal RFin is applied to the gate (i.e., a control terminal) of the transistor M1. The amplified RF output signal RFout is output to the drain of the transistor M2. In other words, the transistor M1 is a common source structure and the transistor M2 is a common gate structure. In FIG. 2, the contact point at which the transistor M1 and the transistor M2 are connected to each other is indicated by N1. The current passing through the transistor M1 is represented by Id1 and the current passing through the transistor M2 is represented by Id2. The gate of the transistor M1 corresponds to the input terminal AF_IN of the amplification unit 200 in FIG. 1 and the drain of the transistor M2 corresponds to the output terminal AF_OUT of the amplification unit 200 in FIG. 1.

A coupling capacitor C1 may be connected to the gate of the transistor M1. The coupling capacitor C1 may perform a function of blocking a direct current (DC) component.

A first bias voltage biasing the transistor M1 may be input to a terminal B1 and the first bias voltage may be applied to the gate of transistor M1 through the resistor R1. Also, a second bias voltage that biases the transistor M2 is input to the terminal B2 and may be applied to the gate of the transistor M2. These first and second bias voltages may set the transistor M1 and the transistor M2 to the operation state, respectively.

The capacitor C2 may be connected between the gate of the transistor M2 and a ground. The capacitor C2 may function to remove an alternating current (AC) component from the second bias voltage.

As shown in FIG. 2, the gain controller 300 may include a transistor M3. The drain of the transistor M3 may be connected to the power source voltage VDD and the source of the transistor M3 may be connected to the contact point N1. A gain control voltage is applied to the gate (the control terminal) of the transistor M3. That is, the gain control voltage may be input to the terminal B3 and applied to the transistor M3. The value of the gain control voltage varies according to the gain mode. In FIG. 2, the current passing through the transistor M3 is represented by Id3. The current Id3 fluctuates according to the value of a third bias voltage, as explained in more detail in FIG. 3 below.

The capacitor C3 may be connected to the gate of the transistor M3 and the ground. The capacitor C3 may play a role of removing an alternating current (AC) component from the third bias voltage.

Figure 3:
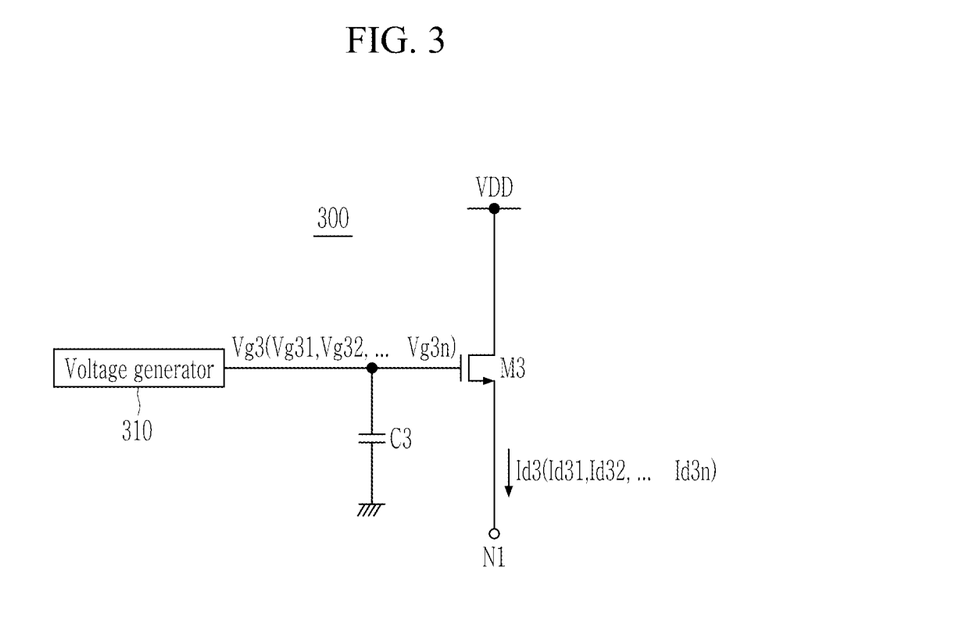
FIG. 3 is a circuit diagram showing a gain controller of the low noise amplifier of FIG. 1, in more detail, according to an embodiment.

FIG. 3 is a circuit diagram showing the gain controller 300 in more detail, according to an embodiment.

As shown in FIG. 3, the gain controller 300 may further include a voltage generator 310. In FIG. 3, the gain control voltage is represented by Vg3.

The voltage generator 310 may generate the gain control voltage Vg3 according to the gain mode and output the gain control voltage Vg3 to the gate (the control terminal) of the transistor M3. The gain mode is a gain mode of the low noise amplifier 1000 and the gain mode may include first to n-th gain modes (where n is a natural number of 2 or more). The voltage generator 310 may receive the gain mode from the outside and may output a plurality of gain control voltages Vg31, Vg32, . . . , Vg3n according to the gain mode. That is, in the first gain mode, the voltage generator 310 may generate the first gain control voltage Vg31 and apply the first gain control voltage Vg31 to the gate of the transistor M3. Also, in the second gain mode, the voltage generator 310 may generate the second gain control voltage Vg32 and apply the second gain control voltage Vg32 to the gate of the transistor M3. In other words, the voltage generator 310 may output the first to n-th gain control voltages Vg31, Vg32, Vg3n corresponding to the first to n-th gain modes, respectively. On the other hand, in FIG. 3, the currents Id3 corresponding to the first to n-th gain modes, respectively, are represented by Id31, Id32, . . . , Idn.

The values of the first to n-th gain control voltages Vg31, Vg32, . . . , Vg3n may satisfy a relationship of Equation 1 below. Here, it is assumed that a gain mode is lowered from the first gain mode to the n-th gain mode. As an example, the first gain mode may be a high gain mode, the second gain mode may be a middle gain mode, and the third gain mode may be a low gain mode.

$$\text{Vg31} < \text{Vg32} < \text{Vg33} \ldots < \text{Vg3}n \qquad \text{Equation 1}$$

In considering the characteristic of the transistor M3, the current Id3 (i.e., the drain current) passing through the transistor M3 increases according to the voltage applied to the gate of the transistor M3. Accordingly, the currents Id31, Id32, 13dn satisfy the relationship of Equation 2 below.

$$\text{Id31} < \text{Id32} < \text{Id33} \ldots < \text{Id3}n \qquad \text{Equation 2}$$

As described above, the gain controller 300 generates the current Id3 corresponding to the gain mode and the generated current Id3 flows toward the contact point N1. Hereinafter, a method in which the gain of the low noise amplifier 1000 is adjusted (varied) is described in more detail.

In FIG. 2, when the gain controller 300 is not included (e.g., when there is no transistor M3), the gain of the low noise amplifier 1000 has the relationship of Equation 3 below. Since the transistor M1 and the transistor M2 are connected in the cascode structure, the gain is as expressed in Equation 3 below.

$$\text{Gain\_Cascode\_LNA} = -gm1(gm2 \times \text{rout1} \times \text{rout\_Ina}) \qquad \text{Equation 3}$$

In Equation 3, gm1 is a transconductance of the transistor M1, and gm2 is a transconductance of the transistor M2. Also, rout1 is an output impedance of the transistor M1, and rout_Ina is a value based on the output impedance of the transistor M2 and the output impedance of the amplification unit 200.

If the gain controller 300 is included as shown in FIG. 2, the entire gain of the low noise amplifier 1000 has the relationship of Equation 4 below. The drain of the transistor M3 is connected to the contact point N1. Accordingly, the transistor M2 and the transistor M3 are seen in parallel for the output impedance of the transistor M1 having a common source amplifier structure. That is, the output impedance of the transistor M1 is $$\text{rout1} \left\| \left( \frac{1}{gm2} \right) \right\| \left( \frac{1}{gm3} \right).$$

In Equation 3, rout1 is replaced with $$\text{rout1} \left\| \left( \frac{1}{gm2} \right) \right\| \left( \frac{1}{gm3} \right).$$

$$\text{Gain}_{\text{Variable\_LNA}} = \qquad \text{Equation 4}$$
$$-gm1 \left( \text{rout1} \left\| \left( \frac{1}{gm2} \right) \right\| \left( \frac{1}{gm3} \right) \right) \times gm2 \times \text{rout\_Ina}$$

In Equation 4, gm3 is a transconductance of the transistor M3.

In FIG. 2, the current Id1, the current Id2, and the current Id3 have the relation of Equation 5 below.

$$\text{Id1} = \text{Id2} + \text{Id3} \qquad \text{Equation 5}$$

Also, gm2 and the current Id2 have the relation of Equation 6 below.

$$gm2 = \sqrt{\left( \frac{2 * Id2}{Vov2} \right)} \qquad \text{Equation 6}$$

In Equation 6, Vov2 is a constant value determined by a magnitude of the transistor M2 and a process parameter. According to Equation 6, when the current Id2 increases, gm2 also increases.

Referring to Equation 5, in the state in which the current Id1 is constant, when the current Id3 increases, the current Id2 decreases. Referring to Equation 6, when the current Id2 decreases, gm2 also decreases. Referring to Equation 4, when gm2 decreases, the entire gain of the low noise amplifier 1000 decreases. That is, when the current Id3 increases by the gain controller 300, the entire gain of the low noise amplifier 1000 decreases. In other words, when the gain control voltage Vg3 increases, the current Id3 increases. Accordingly, the entire gain of the low noise amplifier 1000 is reduced.

A method in which the entire gain of the low noise amplifier 1000 is adjusted (variable) by the gain controller 300 may be described as follows. When the gain control voltage Vg3 increases, the transistor M3 enters the operation state. Accordingly, the current Id3 is generated, and the current Id3 increases as the gain control voltage Vg3 increases. When the current Id3 increases, gm3 of the transistor M3 increases. At this time, the source voltage of the transistor M3 increases and the gate-source voltage Vgs2 of the transistor M2 decreases. As the gate-source voltage Vgs2 of the transistor M2 decreases, gm2 of the transistor M2 decreases. By the reduction of gm2 of the transistor M2, the entire gain of the low noise amplifier 1000 is reduced. That is, when the gain control voltage Vg3 of the gain controller 300 increases, gm2 (the transconductance) of the transistor M2 decreases and the entire gain of the low noise amplifier 1000 decreases.

Hereinafter, operations and the RF signal path of the low noise amplifier 1000 according to the first to third gain modes are described with reference to FIG. 4A to FIG. 4C. As an example, the first gain mode may be a high gain mode, the second gain mode may be a middle gain mode, and the third gain mode may be a low gain mode.

Figure 4A:
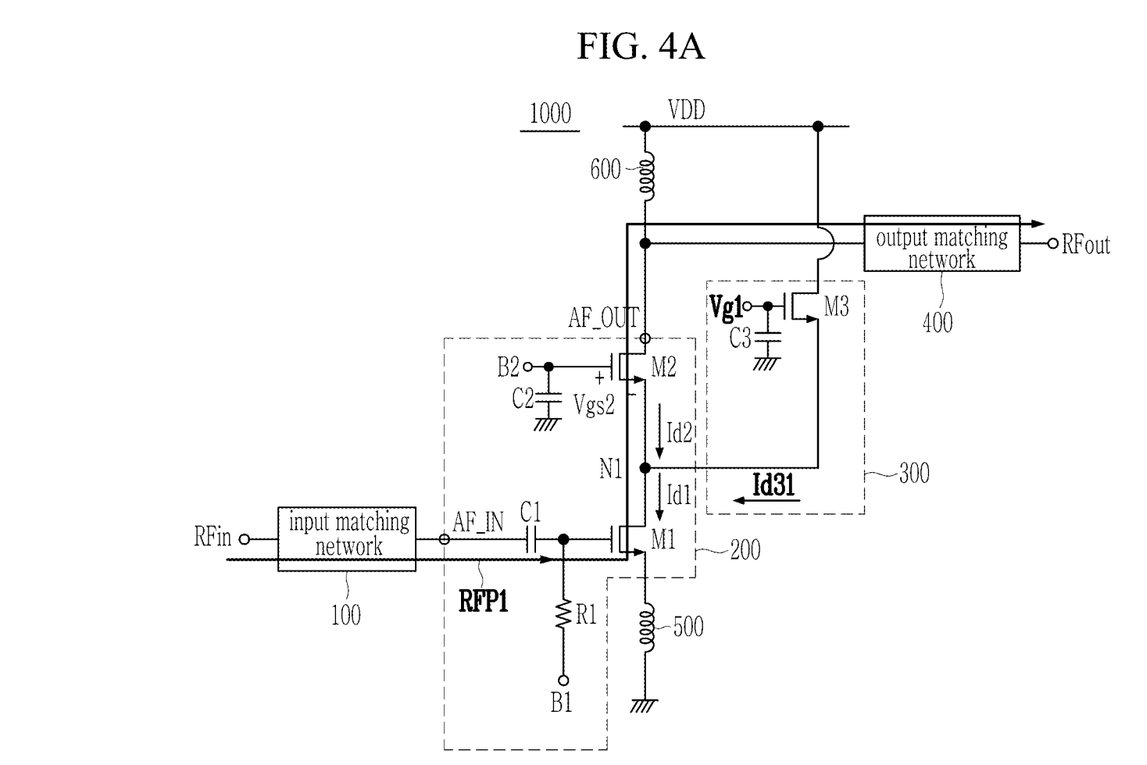
FIG. 4A is a view showing an operation and an RF signal path of the low noise amplifier of FIG. 1 in a first gain mode, according to an embodiment.

FIG. 4A is a view showing an operation and an RF signal path of a low noise amplifier 1000 in a first gain mode.

As described in FIG. 3 above, in the first gain mode, the voltage generator 310 applies the first gain control voltage Vg31 to the gate of the transistor M3. Accordingly, the current Id3 passing through the transistor M3 becomes Id31. The current Id31 flows toward the contact point N1.

In the first gain mode, the RF signal path RFP1 is formed through the input matching network 100, the coupling capacitor C1, the transistor M1, the transistor M2, and the output matching network 400.

Figure 4B:
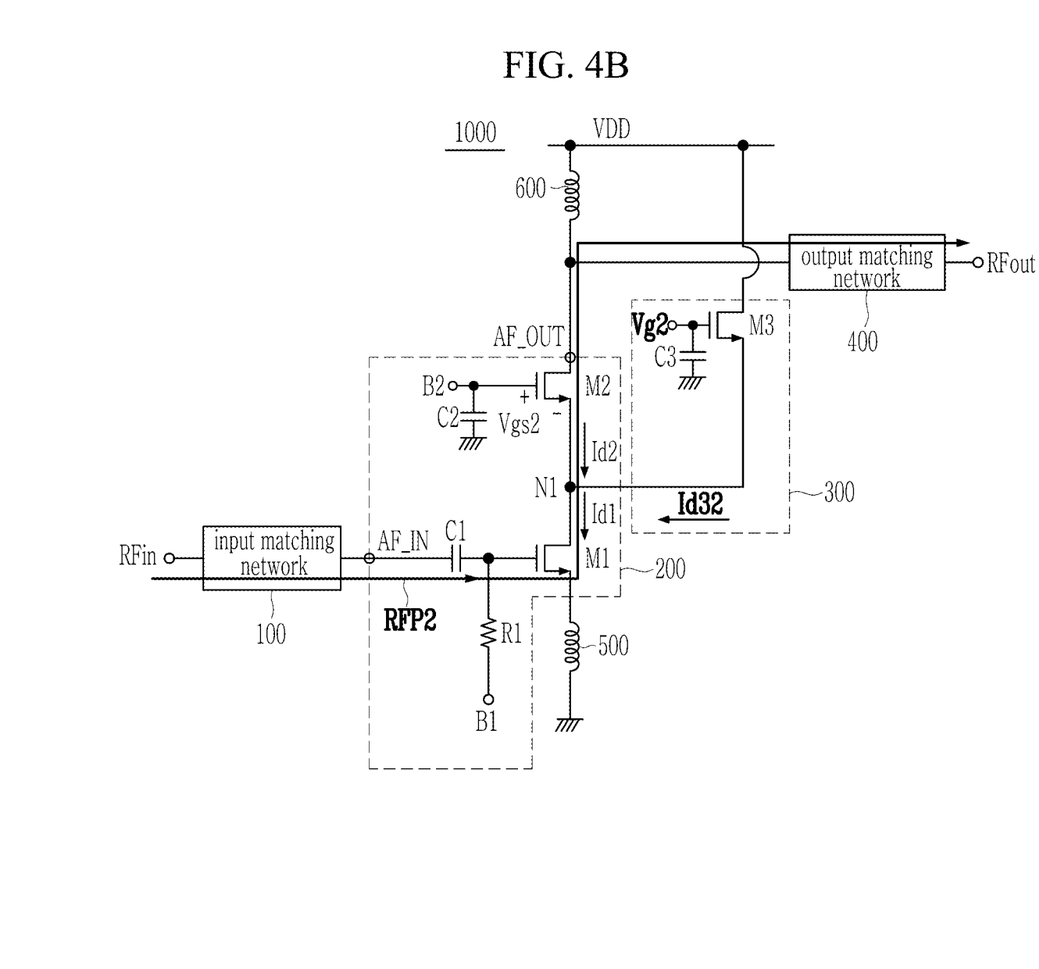
FIG. 4B is a view showing an operation and an RF signal path of the low noise amplifier of FIG. 1 in a second gain mode, according to an embodiment.

FIG. 4B is a view showing an operation and an RF signal path of a low noise amplifier 100 in a second gain mode.

As described in FIG. 3 above, in the second gain mode, the voltage generator 310 applies the second gain control voltage Vg32 to the gate of the transistor M3. Accordingly, the current Id3 passing through the transistor M3 becomes Id32. The current Id32 flows toward the contact point N1. Referring to Equation 2, the value of the current Id32 is a value that is greater than the current Id31. Accordingly, gm2 of the transistor M2 decreases, and the entire gain of the low noise amplifier 1000 decreases. That is, the entire gain of the low noise amplifier 1000 has a smaller value in the second gain mode than in the first gain mode.

In the second gain mode, the RF signal path RFP2 is formed through the input matching network 100, the coupling capacitor C1, the transistor M1, transistor M2, and the output matching network 400. That is, the RF signal path may be the same in the first gain mode and the second gain mode.

Figure 4C:
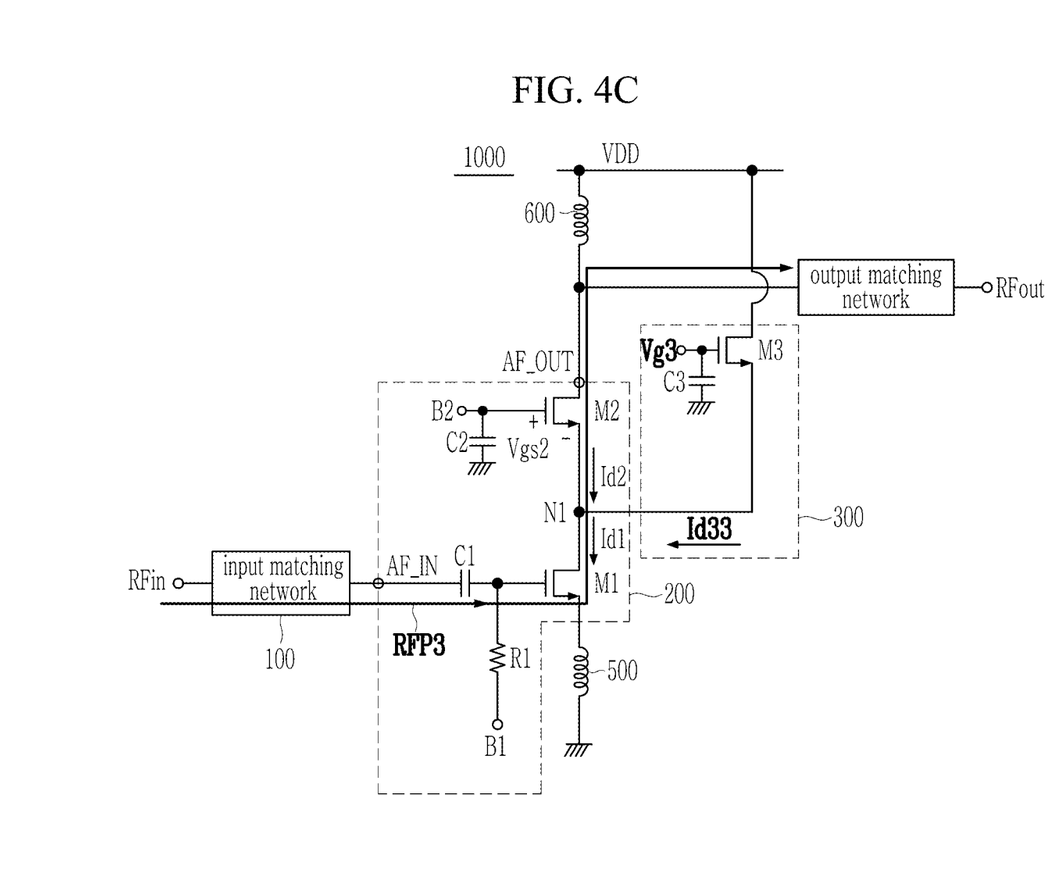
FIG. 4C is a view showing an operation and an RF signal path of the low noise amplifier of FIG. 1 in a third gain mode, according to an embodiment.

FIG. 4C is a view showing an operation and an RF signal path of a low noise amplifier 1000 in a third first gain mode.

As described in FIG. 3 above, in the third gain mode, the voltage generator 310 applies the third gain control voltage Vg33 to the gate of the transistor M3. Accordingly, the current Id3 passing through the transistor M3 becomes Id33. The current Id33 flows toward the contact point N1. Referring to Equation 2, the value of the current Id33 is greater than that of the current Id32. Accordingly, gm2 of the transistor M2 decreases, and the entire gain of the low noise amplifier 1000 decreases. That is, the entire gain of the low noise amplifier 1000 has a smaller value in the third gain mode than in the second gain mode.

In the third gain mode, the RF signal path RFP3 is formed through the input matching network 100, the coupling capacitor C1, the transistor M1, the transistor M2, and the output matching network 400. That is, the RF signal path may be the same in the first to third gain modes.

Referring to FIG. 4A to FIG. 4C, the RF signal path RFP1 of the first gain mode, the RF signal path RFP2 of the second gain mode, and the RF signal path RFP3 of the third gain mode may be the same. That is, in the low noise amplifier 1000, separate paths are not formed according to each gain mode, and the RF signal may be amplified through one (same) RF signal path in each gain mode. In this way, since one (the same) RF signal path is formed according to each gain mode, the impedance matching design of the input matching network 100 and the output matching network 400 may be facilitated. In addition, since the one RF signal path is formed in each gain mode, the entire size of the low noise amplifier can be reduced.

Figure 5:
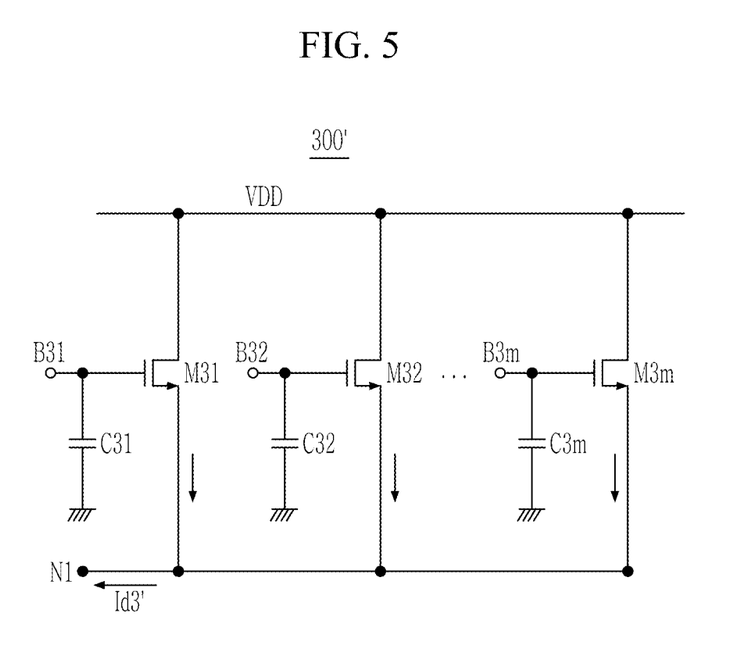
FIG. 5 is a circuit diagram showing a gain controller, according to an embodiment.

FIG. 5 is a circuit diagram showing a gain controller 300', according to an embodiment.

As shown in FIG. 5, the gain controller 300' may include a plurality of transistors M31, M32, . . . , M3m. Here, n is a natural number of greater than 2. That is, the transistor M3 described in FIG. 2 and FIG. 3 is replaced with a plurality of transistors M31, M32, . . . , M3m.

A gain adjustment voltage may be applied to each gate of a plurality of transistors M31, M32, . . . , M3m. Also, each capacitor C31, C32, . . . , C3m may be connected to a gate of a respective one of the transistors M31, M32, . . . , M3m and the ground. The sources of the transistors M31, M32, . . . , M3m are connected to the contact point N1. Through this structure, the current Id3' may be more precisely adjusted. As the current Id3' is precisely adjusted, the entire gain of the low noise amplifier 1000 may also be finely adjusted.

Next, simulation results of the low noise amplifier 1000, according to an embodiment, is described with reference to FIG. 6 to FIG. 9. The simulation results described below were measured while changing the gain control voltage explained in FIG. 2 and FIG. 3 from 0.5 V to 1.4 V step-by-step in increments of 0.1 V.

Figure 6:
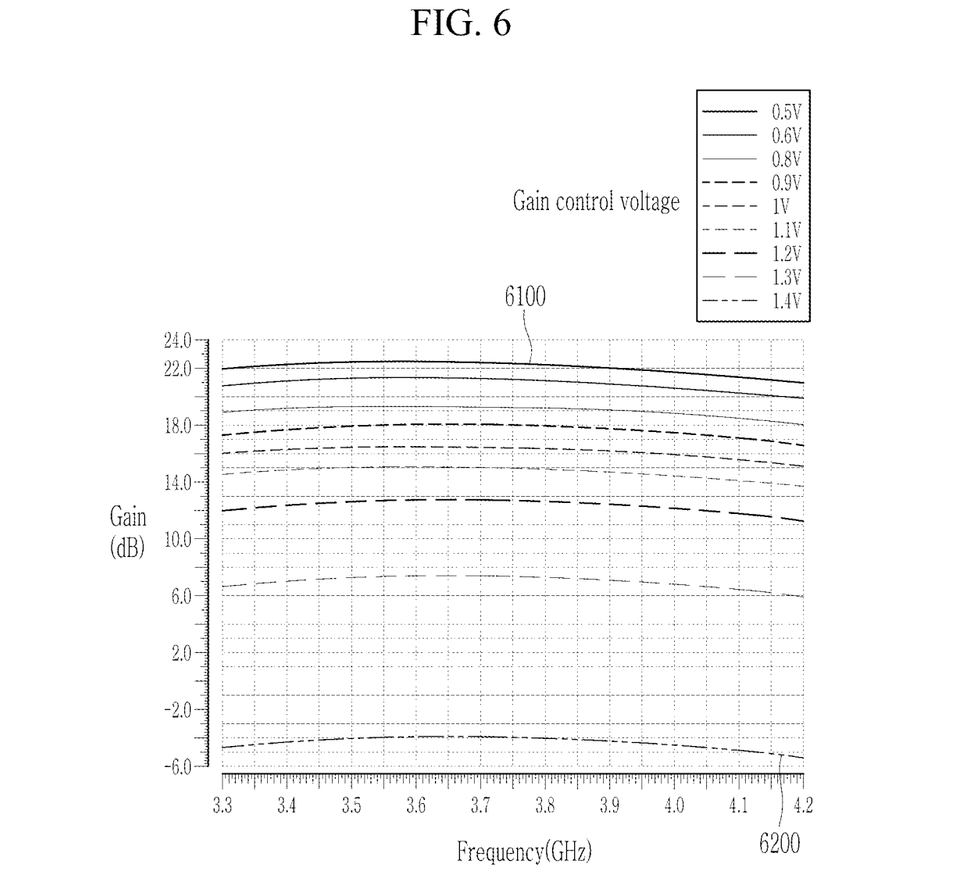
FIG. 6 is a graph showing a simulation result for a gain of the low noise amplifier of FIG. 1, according to an embodiment.

FIG. 6 is a graph showing a simulation result for a gain of the low noise amplifier 1000, according to an embodiment.

In the simulation of FIG. 6, a horizontal axis represents a frequency of the input RF signal and a vertical axis represents the gain Gain (S21 parameter). In FIG. 6, 6100 represents the gain for a case in which the gain control voltage is 0.5 V, and 6200 represents the gain for a case in which the gain control voltage is 1.4 V. Referring to FIG. 6, it may be confirmed that the entire gain of the low noise amplifier 1000 has a range of 21 dB to −2 dB and may have a high dynamic gain range of about 20 dB or more.

Figure 7:
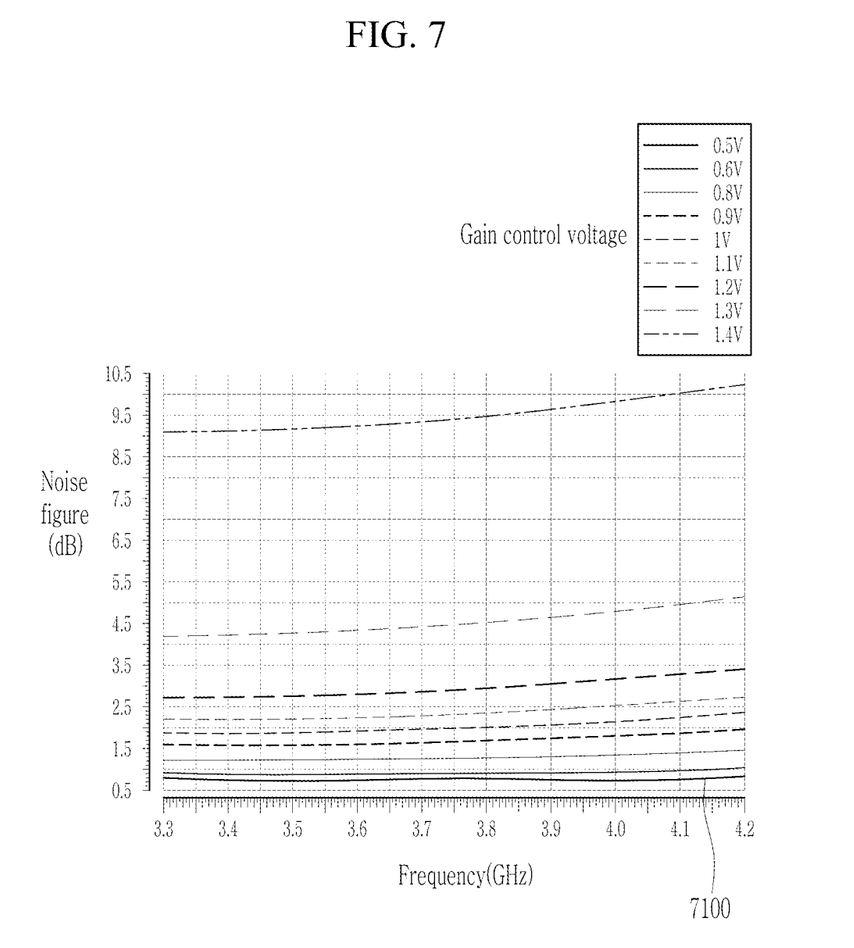
FIG. 7 is a graph showing a simulation result for a noise figure of the low noise amplifier of FIG. 1, according to an embodiment.

FIG. 7 is a graph showing a simulation result for a noise figure of the low noise amplifier 1000, according to an embodiment.

In the simulation of FIG. 7, a horizontal axis represents a frequency of the input RF signal and a vertical axis represents a noise figure. In FIG. 7, 7100 represents the noise figure for a case in which the gain control voltage is 0.5 V. Referring to 7100 of FIG. 7, in the low noise amplifier 1000, it may be confirmed that the noise figure has a level of 0.9 dB in the gain mode having the highest gain. This result corresponds to an equivalent characteristic when compared to a general cascode amplifier (a structure to which the low noise amplifier of an embodiment herein is not applied).

Figure 8:
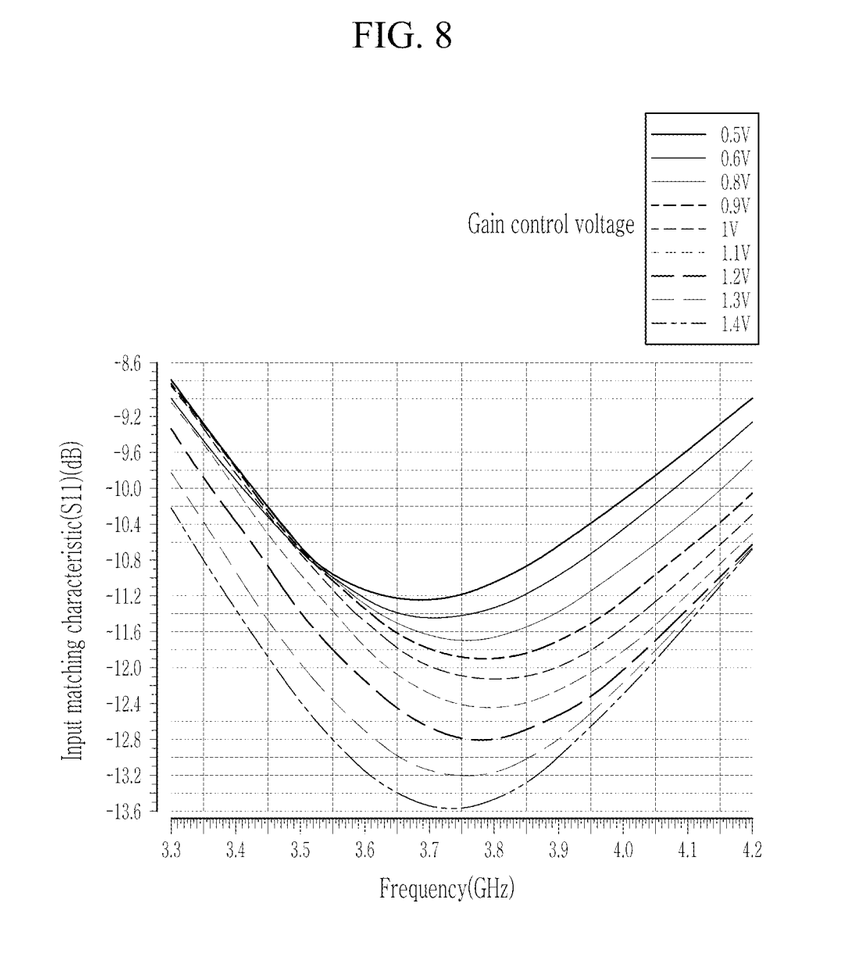
FIG. 8 is a graph showing a simulation result for an input matching characteristic of the low noise amplifier of FIG. 1, according to an embodiment.

FIG. 8 is a graph showing a simulation result for an input matching characteristic of the low noise amplifier 1000, according to an embodiment.

In the simulation of FIG. 8, a horizontal axis represents a frequency of the input RF signal and a vertical axis represents an input matching characteristic (S11 parameter). Referring to FIG. 8, when the gain control voltage has 0.5 V-1.4 V range, the input matching characteristic also maintains −8 dB level.

Figure 9:
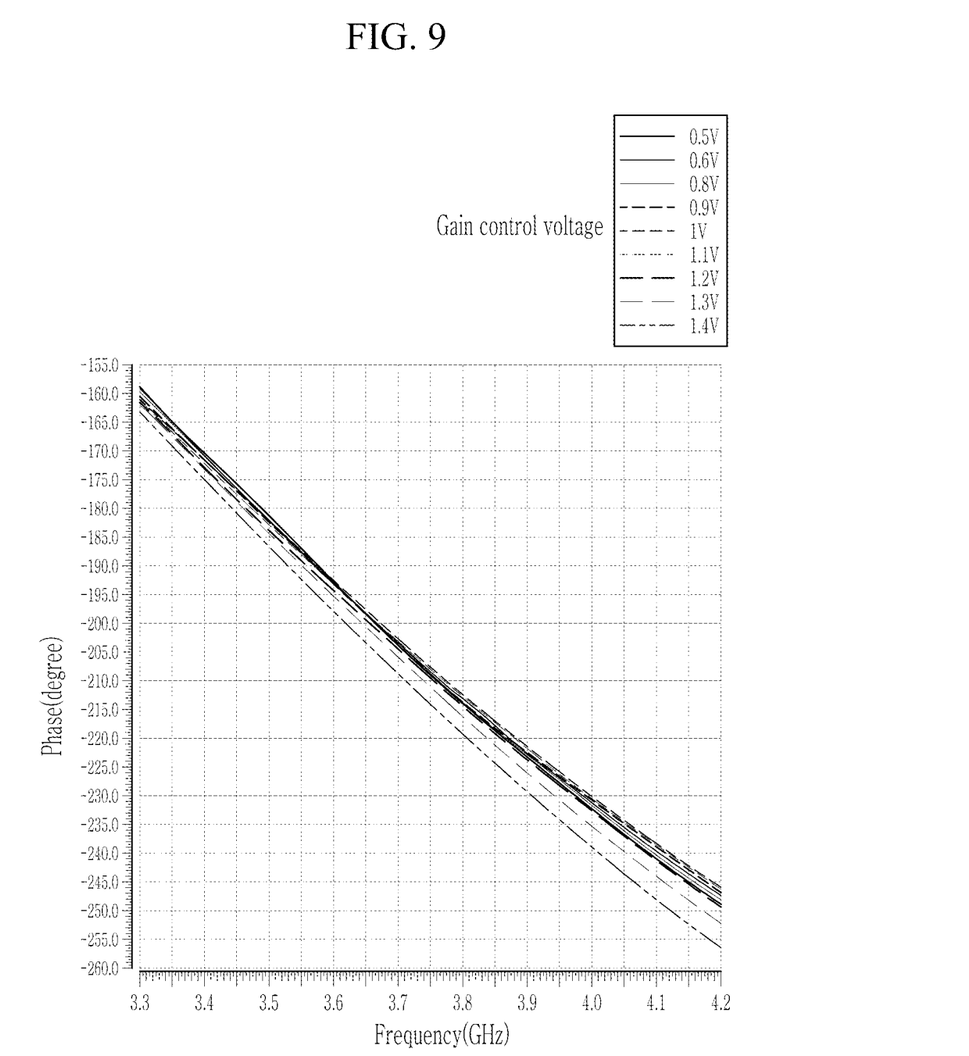
FIG. 9 is a graph showing a simulation result for a phase of the low noise amplifier of FIG. 1, according to an embodiment.

FIG. 9 is a graph showing a simulation result for a phase of the low noise amplifier 1000, according to an embodiment.

In the simulation of FIG. 9, a horizontal axis represents a frequency of an input RF signal and a vertical axis represents a phase (a phase of an S21 parameter). Referring to FIG. 9, when the gain control voltage has the range from 0.5 V to 1.4 V, the phase difference maintains a level within 12 degrees. That is, a phase discontinuity maintains a level within 12 degrees in a range of the gain control voltage.

Referring to the simulation result of FIG. 6 to FIG. 9, the low noise amplifier 1000 is advantageous in that it does not significantly affect performance such as the noise figure, the phase discontinuity, and the impedance matching even in a gain range of 23 dB.

The input matching network 100, the voltage generator 310, and the output matching network 400 in FIGS. 1 to 9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 to 9 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS

1000: low noise amplifier
100: input matching network
200: amplification unit
300, 300': gain controller
400: output matching network
500: inductor
600: inductor

What is claimed is:

1. A low noise amplifier, comprising:
an amplification unit including a first transistor and a second transistor connected in a cascode structure and configured to amplify a signal input to a control terminal of the first transistor; and
a gain controller connected between a contact point at which the first transistor and the second transistor are connected to each other and a power source voltage, and configured to adjust a gain of the amplification unit,
wherein the gain controller comprises a third transistor connected between the contact point and the power source voltage,
wherein a gain control voltage to adjust the gain of the amplification unit is applied to a control terminal of the third transistor, and
wherein the gain control voltage is configured to have a first voltage, a second voltage, and a third voltage for each of a first gain mode, a second gain mode, and a third gain mode.

2. The low noise amplifier of claim 1, wherein, in the first gain mode, the signal is amplified through a path formed through the first transistor and the second transistor,
wherein, in the second gain mode having a lower gain than the first gain mode, the signal is amplified through the path, and
wherein, in the third gain mode having a lower gain than the second gain mode, the signal is amplified through the path.

3. The low noise amplifier of claim 2, further comprising:
an input matching network connected to the control terminal of the first transistor, and an output matching network connected to a first terminal of the second transistor,
wherein the path is formed through the input matching network, the first transistor, the second transistor, and the output matching network.

4. The low noise amplifier of claim 1, wherein the gain controller is further configured to generate a current flowing toward the contact point, and adjust the gain by changing a value of the current.

5. The low noise amplifier of claim 1, wherein the gain decreases as the gain control voltage increases.

6. The low noise amplifier of claim 1, wherein a first terminal of the first transistor is connected to a ground, a second terminal of the first transistor is connected to a first terminal of the second transistor, and the signal is output to a second terminal of the second transistor after being amplified.

7. The low noise amplifier of claim 6, further comprising an inductor connected between the first terminal of the first transistor and the ground.

8. The low noise amplifier of claim 4, wherein the third transistor includes a plurality of transistors connected between the contact point and the power source voltage, and
wherein a gain control voltage to adjust the gain is applied to a control terminal of the plurality of transistors.

9. The low noise amplifier of claim 4, wherein the gain controller is further configured to adjust a transconductance value of the second transistor by changing the value of the current.

10. An operation method of a low noise amplifier including a first transistor and a second transistor connected to each other in a cascode structure, the operation method comprising:
in a first gain mode, providing a first current to a contact point at which the first transistor and the second transistor are connected to each other;
in the first gain mode, amplifying a first radio frequency (RF) signal input to a control terminal of the first transistor with a first gain corresponding to the first current;
in a second gain mode, providing a second current larger than the first current to the contact point;
in the second gain mode, amplifying a second RF signal input to the control terminal of the first transistor with a second gain that is less than the first gain, and corresponding to the second current;
in a third gain mode, providing a third current larger than the second current to the contact point; and
in the third gain mode, amplifying a third RF signal input to the control terminal of the first transistor with a third gain smaller than the second gain, and corresponding to the third current.

11. The operation method of claim 10, wherein, in the first gain mode, the first RF signal is amplified through a path formed through the first transistor and the second transistor,
wherein, in the second gain mode, the second RF signal is amplified through the path, and wherein, in third second gain mode, the third RF signal is amplified through the path.

12. The operation method of claim 11, wherein the low noise amplifier further includes a matching network connected to the control terminal of the first transistor and an output matching network connected to a first terminal of the second transistor, and wherein the path is formed through the input matching network, the first transistor, the second transistor, and the output matching network.

13. The operation method of claim 10, wherein the providing of the first current includes applying a first voltage to a control terminal of a third transistor connected between a power source voltage and the contact point, wherein the providing of the second current includes applying a second voltage higher than the first voltage to the control terminal of the third transistor, and wherein the providing of the third current comprises applying a third voltage higher than the second voltage to the control terminal of the third transistor.

14. The operation method of claim 13, wherein the first transistor is a common source structure and the second transistor is a common gate structure.

15. An amplifier, comprising:

an amplification section including a first transistor and a second transistor connected in a cascode structure and configured to amplify a signal input to a control terminal of the first transistor; and a gain controller, comprising a third transistor connected between the amplification section and a power source voltage, and configured to adjust a gain of the amplification section by selectively applying a first gain mode, a second gain mode, and a third gain mode, wherein the signal is amplified through a same path in each of the different gain modes.

16. The amplifier of claim 15, wherein the gain controller is connected to the amplification section at a contact point at which the first transistor and the second transistor are connected to each other.

17. The amplifier of claim 15, wherein the same path is formed through the first transistor and the second transistor.

18. The amplifier of claim 15, further comprising:

an input matching network connected to the first transistor, and an output matching network connected to the second transistor, wherein the same path is formed through the input matching network, the first transistor, the second transistor, and the output matching network.

19. The amplifier of claim 15, wherein a gain control voltage to adjust the gain is applied to a control terminal of the third transistor.

20. The amplifier of claim 19, wherein the gain decreases as the gain control voltage increases.

* * * * *